(12) United States Patent
Takahashi et al.

(10) Patent No.: US 11,137,451 B2
(45) Date of Patent: Oct. 5, 2021

(54) BATTERY RESISTANCE MEASURING DEVICE

(71) Applicant: TOYOTA JIDOSHA KABUSHIKI KAISHA, Toyota (JP)

(72) Inventors: Kohei Takahashi, Toyota (JP); Sunao Horitake, Toyota (JP); Takayuki Akaishi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 30 days.

(21) Appl. No.: 16/809,961

(22) Filed: Mar. 5, 2020

(65) Prior Publication Data

US 2020/0341068 A1  Oct. 29, 2020

(30) Foreign Application Priority Data

Apr. 25, 2019 (JP) ............................. JP2019-083957

(51) Int. Cl.
    *G01R 31/389* (2019.01)
    *G01R 31/374* (2019.01)
    *G01R 31/3842* (2019.01)
    *G01R 31/392* (2019.01)

(52) U.S. Cl.
CPC ......... *G01R 31/389* (2019.01); *G01R 31/374* (2019.01); *G01R 31/3842* (2019.01); *G01R 31/392* (2019.01)

(58) Field of Classification Search
None
See application file for complete search history.

(56) References Cited

U.S. PATENT DOCUMENTS

| 2006/0186890 | A1 | 8/2006 | Iwane et al. |
| 2007/0252601 | A1 | 11/2007 | Satoh et al. |
| 2016/0161566 | A1* | 6/2016 | Chen ................... G01R 31/3842 320/109 |

FOREIGN PATENT DOCUMENTS

| JP | 2005-221487 A | 8/2005 |
| JP | 2016-114584 A | 6/2016 |

* cited by examiner

*Primary Examiner* — Jas A Sanghera
(74) *Attorney, Agent, or Firm* — Oliff PLC

(57) ABSTRACT

An auxiliary device battery sensor measures current and voltage of an auxiliary device battery. On the basis of a peak value and frequency of current measured by the auxiliary device battery sensor at a time when the current and the voltage of the auxiliary device battery change in accordance with requirements of a load, a monitoring ECU sets a waveform for measurement that is for measuring resistance of the auxiliary device battery. Further, the monitoring ECU controls a DDC that is connected to the auxiliary device battery, such that a waveform of the current of the auxiliary device battery becomes the waveform for measurement. The monitoring ECU estimates resistance of the auxiliary device battery on the basis of current and voltage measured by the auxiliary device battery sensor at a time of controlling the DDC.

16 Claims, 5 Drawing Sheets

FIG.4
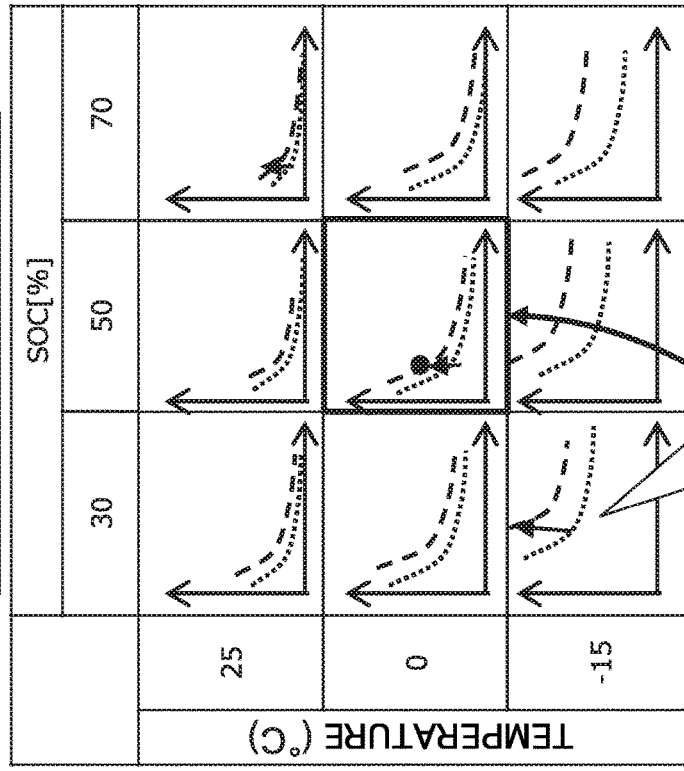
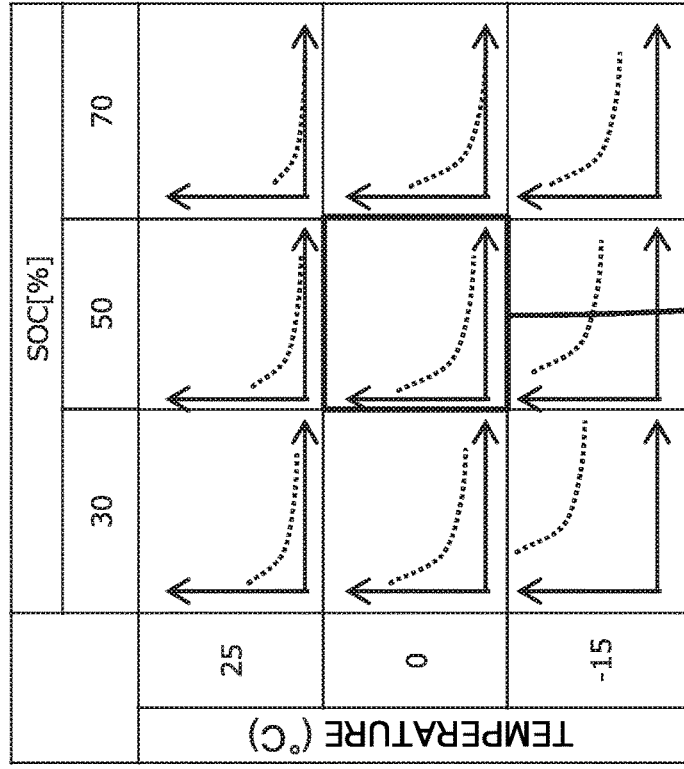
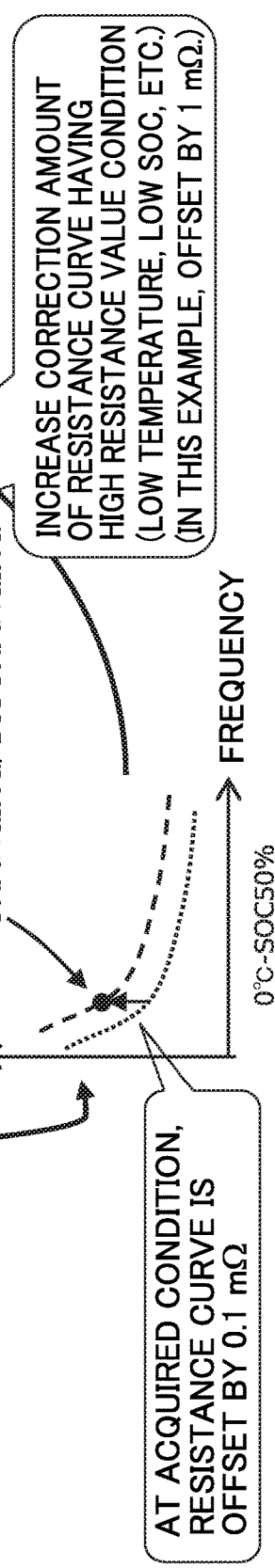

BATTERY RESISTANCE MEASURING DEVICE

CROSS-REFERENCE TO RELATED APPLICATION

This application is based on and claims priority under 35 USC 119 from Japanese Patent Application No. 2019-083957 filed on Apr. 25, 2019, the disclosure of which is incorporated by reference herein.

BACKGROUND

Technical Field

The present disclosure relates to a battery resistance measuring device.

Related Art

In the technique disclosed in Japanese Patent Application Laid-Open (JP-A) No. 2016-114584 (Patent Document 1), a DCDC converter is operated in order to supply electric power from an auxiliary device battery to a high-voltage battery, and the internal resistance of the auxiliary device battery is estimated on the basis of the detected value of the voltage across the terminals of the auxiliary device battery and the detected value of the current that flows to the auxiliary device battery. Further, the internal resistance is corrected on the basis of the SOC of the auxiliary device battery and the detected value of the temperature of the auxiliary device battery, and the state of deterioration of the auxiliary device battery is judged on the basis of the corrected internal resistance.

The technique disclosed in Patent Document 1 estimates the resistance of the battery from the relationship between the current and the voltage of the battery at the time of carrying out a precharging operation that charges a capacitor from the battery (the auxiliary device battery). However, changes in the current and the voltage of the battery at the time when a precharging operation is carried out are different from changes in the current and the voltage of the battery in a case in which there are load requirements. Therefore, the resistance of the battery that is measured by the technique of Patent Document 1 greatly differs from the resistance of the battery in a case in which there are load requirements, and the accuracy of measuring the resistance of the battery is insufficient.

SUMMARY

The present disclosure was made in view of the above-described circumstances, and an object thereof is to provide a battery resistance measuring device that can improve the accuracy of measuring the resistance of a battery.

A battery resistance measuring device relating to a first aspect includes: a measuring section that measures current and voltage of a battery installed in a vehicle; a setting section that sets a waveform for measurement that is for measuring resistance of the battery, on the basis of a peak value and frequency of current or voltage that is measured by the measuring section at a time when the current and the voltage of the battery change in accordance with requirements of a load that is installed in the vehicle; a control section that controls a DCDC converter connected to the battery, such that a waveform of the current or the voltage of the battery becomes the waveform for measurement that was set by the setting section; and a computing section that computes resistance of the battery on the basis of current and voltage measured by the measuring section at a time when the DCDC converter is controlled by the control section.

In the first aspect, a waveform for measurement that is for measuring resistance of the battery is set on the basis of the peak value and the frequency of the current or the voltage of the battery at the time when the current and the voltage of the battery change in accordance with the requirements of a load that is installed in the vehicle. Further, the DCDC converter is controlled such that the waveform of the current or the voltage of the battery becomes the waveform for measurement, and the resistance of the battery is computed on the basis of the current and the voltage of the battery at that time. Due thereto, the resistance of the battery at the time when the current and the voltage of the battery change in accordance with load requirements can be computed, and the accuracy of measuring the resistance of the battery can be improved.

In a second aspect, in the first aspect, in a case in which a peak value of the current or the voltage measured by the measuring section at a time when the current and the voltage of the battery change in accordance with requirements of the load, is less than or equal to an upper limit value of control being possible at the DCDC converter, the setting section sets the peak value to be a peak value of the waveform for measurement, and, in a case in which the peak value of the current or the voltage measured by the measuring section at the time when the current and the voltage of the battery change in accordance with requirements of the load, exceeds the upper limit value of control being possible at the DCDC converter, the setting section sets the upper limit value to be the peak value of the waveform for measurement.

In accordance with the second aspect, the upper limit value of control being possible at the DCDC converter does not have to always exceed the peak value of the current or the voltage that is measured at the time when the current and the voltage of the battery change in accordance with load requirements. Therefore, the DCDC converter can be structured inexpensively.

In a third aspect, in the first or second aspect, at a time when the DCDC converter is controlled by the control section, the computing section carries out frequency analysis on changes in the current and the voltage measured by the measuring section, and, from ratios of current and voltage at each of respectively different frequencies, computes resistances of the battery at each of respectively different frequencies.

In accordance with the third aspect, the resistance of the battery at each of frequencies that differ from one another can be computed, and the relationship between the frequency of the current or the voltage of the battery and the resistance of the battery can be determined.

In a fourth aspect, in the third aspect, the setting section sets the waveform for measurement to be a waveform that combines waveforms of changes in the current or the voltage of the battery that correspond to each of respectively different loads.

In accordance with the fourth aspect, even in a case in which different frequency components are included in the waveforms corresponding to respectively different loads, the computing section can compute the resistance of battery at each of the frequencies corresponding to the respective frequency components, by the control section controlling the DCDC converter a single time.

In a fifth aspect, the fourth aspect further includes a correcting section that, in a resistance map in which a resistance curve, which expresses a relationship between frequency of the current or the voltage of the battery and resistance of the battery, is prescribed for each combination of temperature and SOC of the battery, corrects a first resistance curve, which corresponds to a combination of a present temperature and SOC of the battery, on the basis of resistance of the battery at each of respectively different frequencies computed by the computing section, and corrects second resistance curves, which are other than the first resistance curve in the resistance map, respectively in accordance with an amount of correction for the first resistance curve.

In accordance with the fifth aspect, the first resistance curve is corrected on the basis of the resistance of the battery at each of the respectively different frequencies. The second resistance curves are respectively corrected in accordance with the amount of correction for the first resistance curve. Due thereto, a highly accurate resistance map can be obtained.

In a sixth aspect, the fifth aspect further includes a judging section that, from a resistance curve, which corresponds to the combination of the present temperature and SOC of the battery in the resistance map, and an assumed load current that is a current of the battery that corresponds to requirements of a predetermined load, and frequency thereof, estimates an assumed load voltage, which is a voltage of the battery corresponding to requirements of the predetermined load, and judges deterioration of the battery by comparing the assumed load voltage that is estimated with a predetermined value.

In accordance with the sixth aspect, an assumed load voltage that corresponds to the requirements of a predetermined load can be estimated with good accuracy, and deterioration of the battery can be judged with good accuracy.

In a seventh aspect, in any one of the first through sixth aspects, the battery is a lithium ion battery.

Measuring and managing the resistance of a lithium ion battery in order to prevent a drop in voltage of the battery due to over-discharging is desirable, and the present disclosure is suited to lithium ion batteries.

In an eighth aspect, in any one of the first through seventh aspects, the battery is an auxiliary device battery that supplies electric power to an auxiliary device load of a vehicle.

The current and the voltage of an auxiliary device battery of a vehicle change in accordance with the requirements of various loads that are installed in the vehicle. Because the resistance varies accompanying this, the present disclosure is suited to auxiliary device batteries of vehicles.

The present disclosure has the effect of improving the accuracy of measuring the resistance of a battery.

BRIEF DESCRIPTION OF THE DRAWINGS

FIG. 4 is an explanatory drawing for explaining correction of a resistance map.

DETAILED DESCRIPTION

Figure 1:
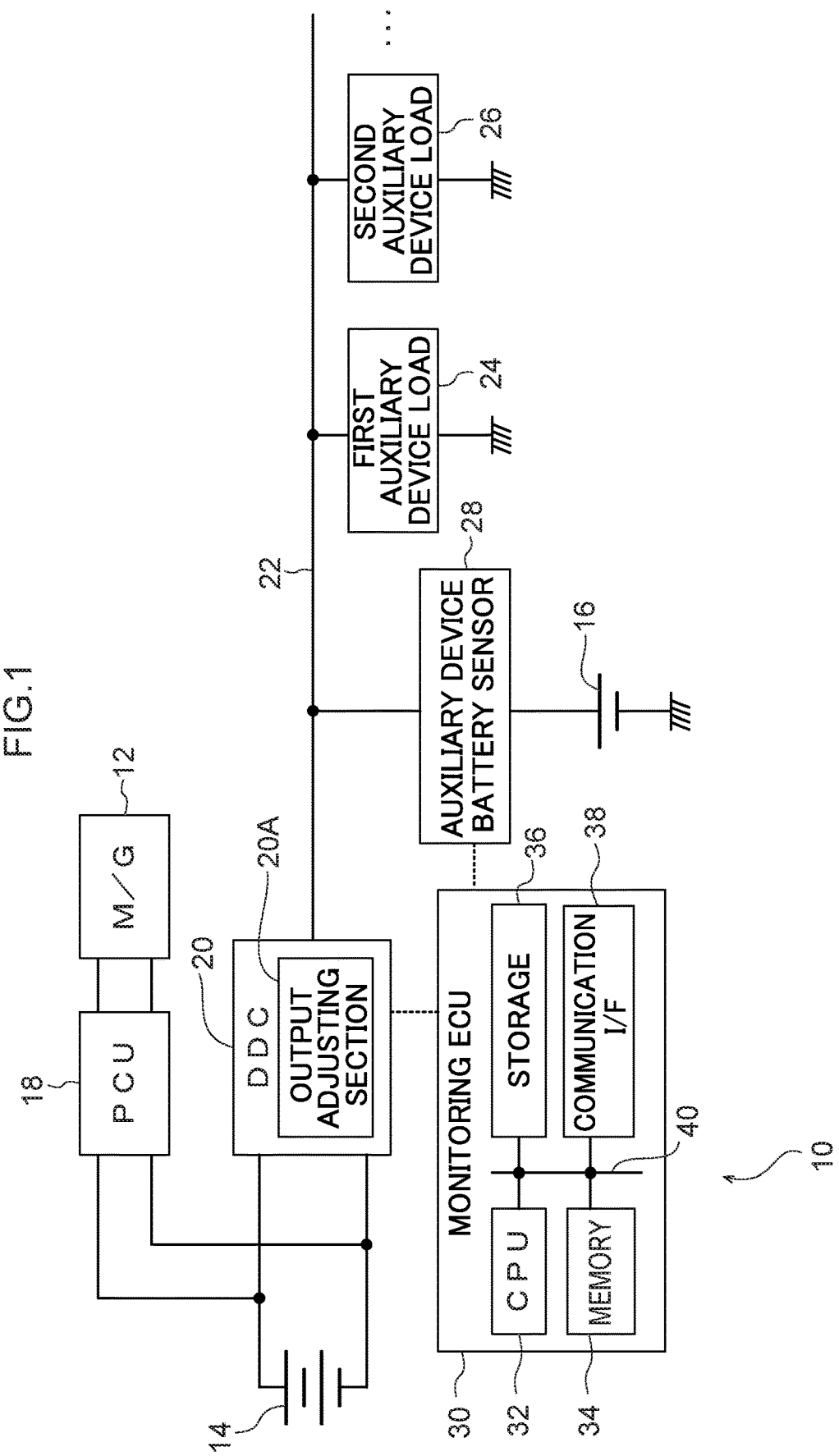
FIG. 1 is a block drawing showing the schematic structure of an onboard system relating to an embodiment.

An example of an embodiment of the present disclosure is described in detail hereinafter with reference to the drawings. A vehicle in which an onboard system 10 shown in FIG. 1 is installed is a so-called hybrid vehicle in which are installed an unillustrated engine, a motor generator (hereinafter called "MG") 12 that works as a motor that causes the vehicle to travel and functions as a generator, a high-voltage battery 14, and an auxiliary device battery 16 that is lower voltage than the high-voltage battery 14. Note that, in the present embodiment, the auxiliary device battery 16 is a lithium ion battery. The high-voltage battery 14 may be a lithium ion battery, or may be a nickel hydrogen battery.

The high-voltage battery 14 is connected to a power control unit (hereinafter called "PCU") 18, and the MG 12 is connected to the PCU 18. The PCU 18 includes an inverter that can convert AC electric power to DC electric power, and can convert DC electric power to AC electric power. In a case in which the MG 12 is functioning as the motor, electric power is supplied from the high-voltage battery 14 via the PCU 18 to the MG 12. In a case in which the MG 12 is working as a generator, the electric power that is generated by the MG 12 is supplied via the PCU 18 to the high-voltage battery 14, and the high-voltage battery 14 is thereby charged.

A DCDC converter (hereinafter called "DDC") 20 is provided between the high-voltage battery 14 and the auxiliary device battery 16. The DDC 20 includes an output adjusting section 20A that can, in accordance with instructions from a monitoring ECU 30 that is described later, adjust the output such that the current or the voltage of the auxiliary device battery 16 becomes the instructed value.

Plural auxiliary device loads (shown as first auxiliary device load 24 and second auxiliary device load 26 in FIG. 1) are respectively connected to an electric wire 22 that connects the DDC 20 and the auxiliary device battery 16 side. Examples of the first auxiliary device load 24 and the second auxiliary device load 26 are an ECU (Electronic Control Unit) that carries out various types of control, various actuators (motors and solenoids), various lights (lamps and in-cabin lighting), various air conditioning devices (heaters and coolers) and the like.

The auxiliary device battery 16 supplies electric power to the first auxiliary device load 24 and the second auxiliary device load 26. In a case in which the engine is operating, the auxiliary device battery 16 is charged due to electric power being supplied to the auxiliary device battery 16 from a generator (not illustrated) that is added to the engine.

An auxiliary device battery sensor 28 is provided between the auxiliary device battery 16 and the DDC 20. The auxiliary device battery sensor 28 measures the current that flows through the auxiliary device battery 16 and the voltage across the terminals of the auxiliary device battery, and measures the temperature of the auxiliary device battery 16 (or the outside air temperature). Note that the auxiliary device battery sensor 28 is an example of the measuring section.

The auxiliary device battery sensor 28 and the DDC 20 are connected to the monitoring ECU 30. The monitoring ECU 30 includes a CPU (Central Processing Unit) 32, a memory 34 such as a ROM (Read Only Memory) or a RAM (Random Access Memory) or the like, a non-volatile storage 36 such as an HDD (Hard Disk Drive) or an SSD (Solid State Drive) or the like, and a communication I/F (InterFace) 38. The CPU 32, the memory 34, the storage 36 and the communication OF 38 are connected to one another via an internal bus 40.

A battery monitoring program and a resistance map of the auxiliary device battery 16 (details of which are described later) are stored in the storage 36. The monitoring ECU 30 carries out battery monitoring processing that is described later due to the battery monitoring program being read-out from the storage 36 and expanded in the memory 34, and the battery monitoring program that is expanded in the memory 34 being executed by the CPU 32.

Figure 2:
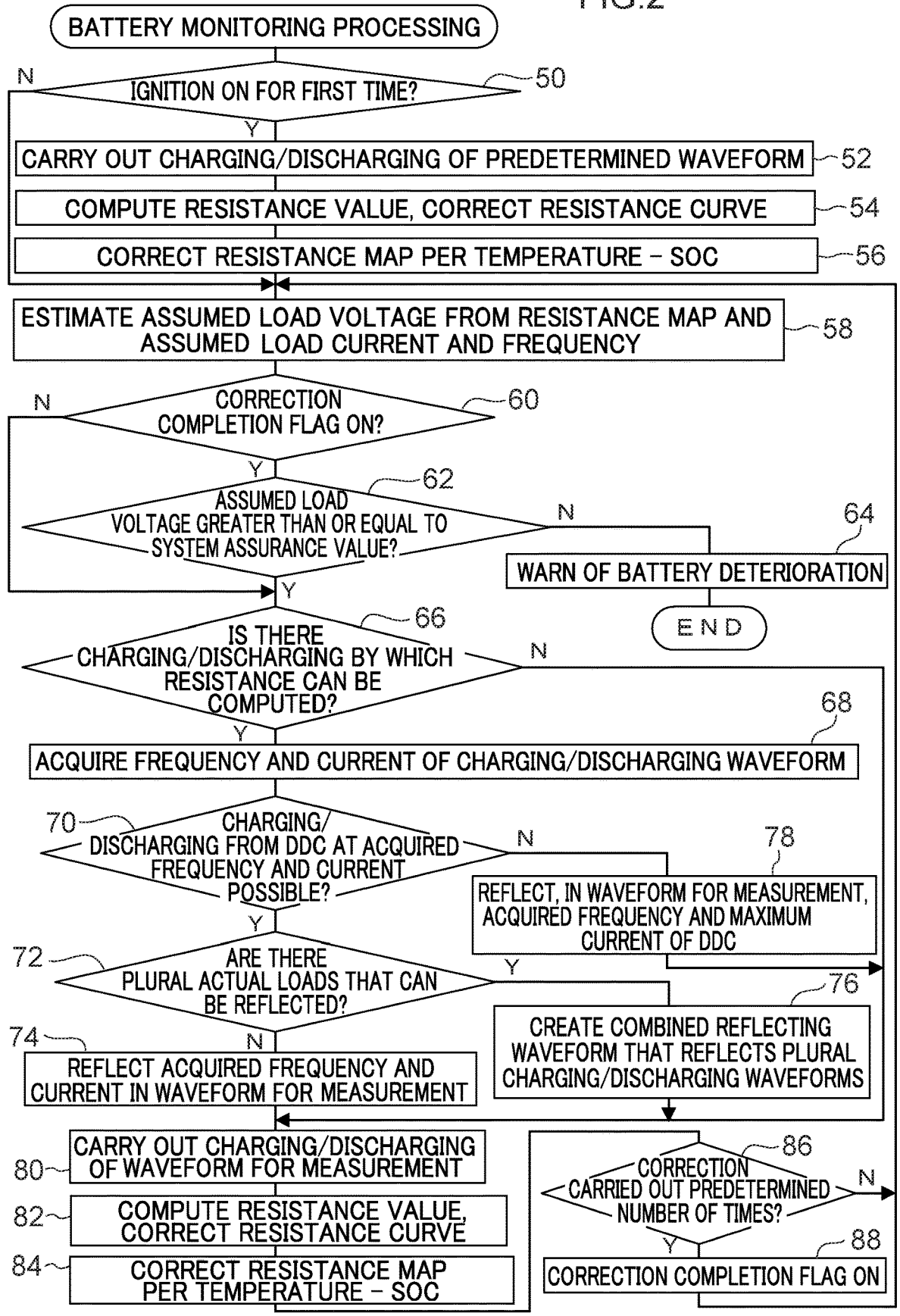
FIG. 2 is a flowchart showing an example of battery monitoring processing.

Battery monitoring processing, which is executed by the monitoring ECU 30 when the ignition switch of the vehicle is turned on, is described next as operation of the present embodiment and with reference to FIG. 2.

In step 50, the monitoring ECU 30 judges whether or not the this-time operation of the turning the ignition switch on is the first turning-on operation since the vehicle has been shipped-out or the first since the auxiliary device battery 16 has been replaced. If the judgment in step 50 is affirmative, the routine moves on to step 52. Note that, if the judgment in step 50 is negative, step 52 through step 56 that are described hereinafter are skipped, and the routine moves on to step 58.

Figure 3:
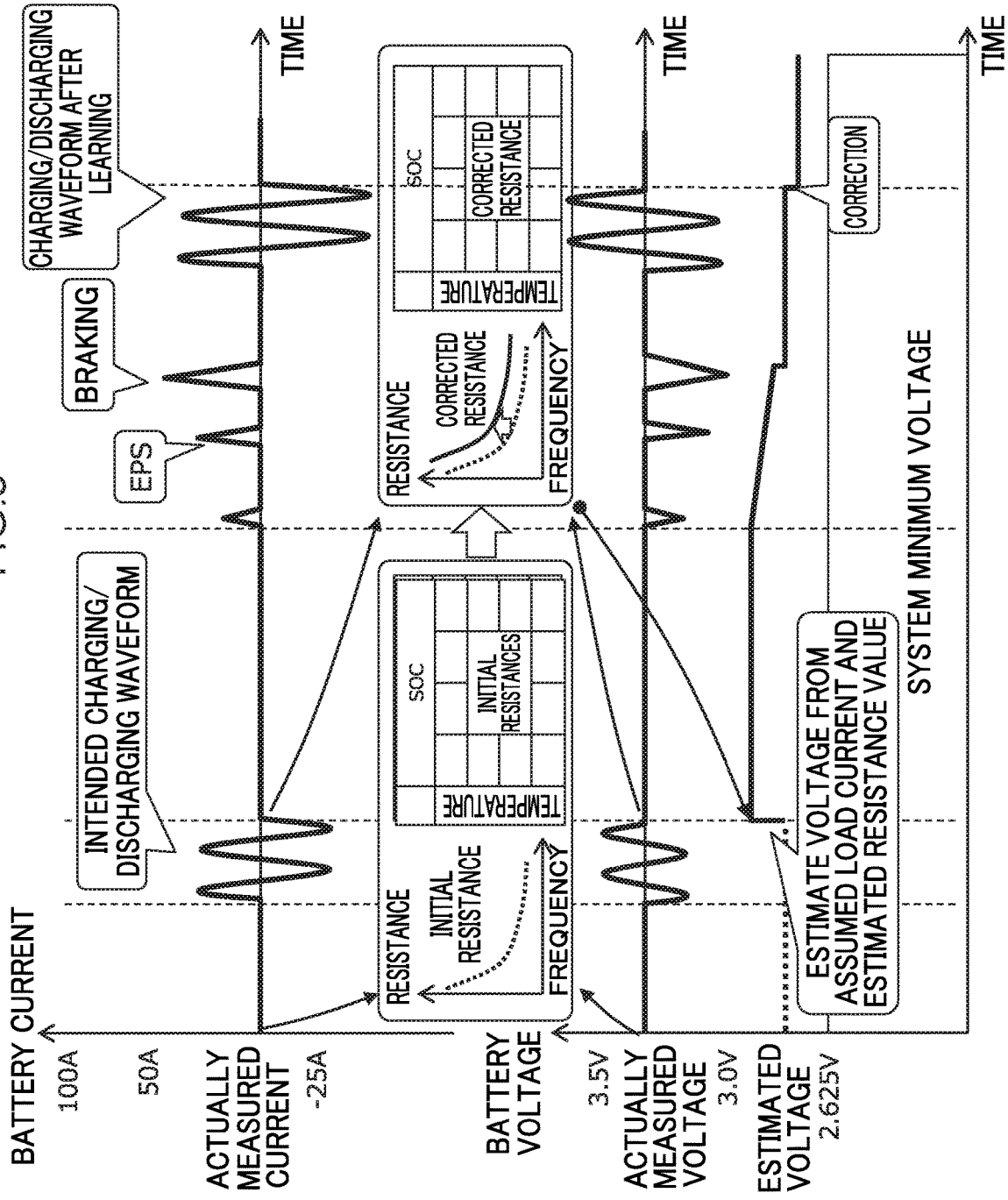
FIG. 3 is an explanatory drawing for explaining learning of a charging/discharging waveform and estimation of assumed load voltage.

In step 52, the monitoring ECU 30 outputs an instruction to the output adjusting section 20A of the DDC 20 so that the current from the auxiliary device battery 16 coincides with a predetermined charging/discharging waveform, as indicated by "intended charging/discharging waveform" in FIG. 3. This is carried out by measuring the current from the auxiliary device battery 16 each predetermined time period by the auxiliary device battery sensor 28, and, in accordance with the difference between the measured value of the current and the predetermined charging/discharging waveform, feeding-back, moment-by-moment, the instructed value given to the output adjusting section 20A of the DDC 20 such as, for example, A1 ampere after t2 ms, and A2 ampere after t2 ms. Due thereto, the current from the auxiliary device battery 16 exhibits changes that coincide with the predetermined charging/discharging waveform, and changes in the current and the voltage of the auxiliary device battery 16 are detected by the auxiliary device battery sensor 28.

In step 54, the monitoring ECU 30 carries out frequency analysis by fast Fourier transform (FFT) respectively on the changes in the current and the changes in the voltage of the auxiliary device battery 16 that are detected by the auxiliary device battery sensor 28. The monitoring ECU 30 computes the resistance of the auxiliary device battery 16 at each of respectively different frequencies, from the ratios of the currents and the voltages at each of the respectively different frequencies.

As shown in FIG. 4 as an example, a resistance map of the auxiliary device battery 16 that is stored in the storage 36 is structured such that a resistance curve, which expresses the relationship between the frequency of the current of the auxiliary device battery 16 and the resistance of the auxiliary device battery 16, is stipulated for each combination of temperature and SOC of the auxiliary device battery 16. In step 54, a first resistance curve, which corresponds to the combination of the present temperature and SOC of the auxiliary device battery 16, is extracted from among the plural resistance curves included in the resistance map, and the extracted first resistance curve is corrected on the basis of the resistance of the auxiliary device battery 16 at each of respectively different frequencies that were computed previously.

As an example, FIG. 4 illustrates an example in which the resistance curve, which corresponds to the combination of a temperature of 0° C. and an SOC of the auxiliary device battery 16 of 50%, is corrected in accordance with the resistance value acquired by charging/discharging. Note that, in the resistance map shown in FIG. 4, the temperatures and the SOCs of the auxiliary device battery 16 are divided into three levels each. However, at least one of the temperatures and the SOCs of the auxiliary device battery 16 may be divided into a larger number of levels.

In next step 56, the monitoring ECU 30 respectively corrects, in the resistance map of the auxiliary device battery 16, second resistance curves that are other than the first resistance curve that was corrected in step 54, in accordance with the amount of correction for the first resistance curve. The correcting of the individual second resistance curves can be carried out, for example, by increasing or decreasing the correction amount on the basis of the corresponding conditions of temperature and SOC of the auxiliary device battery 16, in accordance with whether the conditions are such that the resistance value is higher or the resistance value is lower.

As an example, as shown in FIG. 4, in a case in which a resistance curve, which serves as the first resistance curve and corresponds to a combination of a temperature of 0° C. and an SOC of the auxiliary device battery 16 of 50%, is corrected by a correction amount of 0.1 mΩ, the correction amount is made to be, for example, 1 mΩ for a resistance curve that corresponds to conditions of a higher resistance value (for example, conditions of a lower temperature and a lower SOC (e.g., the conditions of a temperature of −15° C. and an SOC of 30%)). Further, the correction amount is made to be, for example, 0.05 mΩ for a resistance curve that corresponds to conditions of a lower resistance value (for example, conditions of a higher temperature and a higher SOC (e.g., the conditions of a temperature of 25° C. and an SOC of 70%)).

In step 58, the monitoring ECU 30 extracts, from the resistance map of the auxiliary device battery 16, the first resistance curve that corresponds to the combination of the present temperature and SOC of the auxiliary device battery 16. Then, an assumed load voltage, which is the voltage of the auxiliary device battery 16 that corresponds to the requirements of a predetermined load, is estimated from the extracted first resistance curve, and an assumed load current that is the current of the auxiliary device battery 16 that corresponds to the requirements of the predetermined load, and the frequency thereof.

Note that a load, at which it is assumed that the voltage of the auxiliary device battery 16 will change relatively greatly, or the like is an example of the predetermined load. As an example, in a case in which the predetermined load is a load at which a state in which the assumed load current is high continues for 10 seconds, the resistance at a frequency of 0.1 Hz is acquired from the first resistance curve, and the assumed load voltage is estimated by multiplying the acquired resistance by the assumed load current.

In next step 60, the monitoring ECU 30 judges whether or not a correction completion flag is on. The correction completion flag is initially off, and is turned on through the processes of correcting the resistance map that are described later. If the judgment of step 60 is negative, the routine moves on to step 66.

In step 66, the monitoring ECU 30 judges whether or not there has been charging/discharging by which the resistance of the auxiliary device battery 16 can be computed. In the present embodiment, because the resistance is computed by using FFT, a constant load (e.g., the air conditioning load or the like), at which the current or the like of the auxiliary device battery 16 exhibits a constant value such as the air conditioning load or the like, is charging/discharging by which the resistance of the auxiliary device battery 16 cannot be computed and is therefore excluded. If the judgment in step 66 is negative, the routine moves on to step 80.

On the other hand, in a case in which there has been charging/discharging by which the resistance of the auxiliary device battery 16 can be computed, the judgment in step 66 is affirmative, and the routine moves on to step 68. If there has been charging/discharging by which the resistance of the auxiliary device battery 16 can be computed, in step 68, the monitoring ECU 30 acquires the frequency (the width of the change) and the current of the charging/discharging waveform by carrying out frequency analysis by FFT on the change in the current of the auxiliary device battery 16 detected by the auxiliary device battery sensor 28.

In step 70, the monitoring ECU 30 judges whether or not charging/discharging from the DDC 20 is possible at the frequency and the current of the charging/discharging waveform that were acquired in step 68. An upper limit value on the current that can be controlled at the DDC 20 exists. In a case in which the current of the charging/discharging waveform that was acquired in step 68 is less than or equal to the upper limit value, the judgment in step 70 is affirmative, and the routine moves on to step 72.

In step 72, the monitoring ECU 30 judges whether or not there exist plural charging/discharging waveforms of actual load that can be reflected in a waveform for measurement that is for measuring the resistance of the auxiliary device battery 16. If there exists only one charging/discharging waveform of actual load that can be reflected in a waveform for measurement, the judgment in step 72 is negative, and the routine moves on to step 74. In step 74, by making the frequency of the waveform for measurement coincide with the frequency acquired in step 68, and making the current of the waveform for measuring coincide with the current acquired in step 68, the waveform for measurement is set such that the frequency and the current of the charging/discharging waveform acquired in step 68 are reflected.

Further, if the judgment in step 72 is affirmative, the routine moves on to step 76. In step 76, due to the monitoring ECU 30 creating a combined reflecting waveform that reflects respective, plural charging/discharging waveforms of actual loads, a waveform that combines plural charging/discharging waveforms of actual loads is set as the waveform for measurement.

Further, in step 78, due to the monitoring ECU 30 making the frequency of the waveform for measurement coincide with the frequency acquired in step 68, and making the current of the waveform for measurement coincide with the upper limit value of the current that can be controlled at the DDC 20, the waveform for measurement is set such that this upper limit value becomes the peak value of the waveform for measurement. Note that above-described step 74 through step 78 are examples of processings by the setting section.

In step 80, the monitoring ECU 30 outputs an instruction to the output adjusting section 20A of the DDC 20 so that the current from the auxiliary device battery 16 coincides with the waveform for measurement, as indicated by "charging/discharging waveform after learning" in FIG. 3. Due thereto, the current from the auxiliary device battery 16 exhibits changes that coincide with the waveform for measurement, and changes in the current and the voltage of the auxiliary device battery 16 are detected by the auxiliary device battery sensor 28. Note that step 80 is an example of processing by the control section.

In step 82, in the same way as in previously-described step 54, the monitoring ECU 30 carries out frequency analysis by FFT respectively on changes in the current and changes in the voltage of the auxiliary device battery 16 that are detected by the auxiliary device battery sensor 28, and computes the resistance of the auxiliary device battery 16 at each of respectively different frequencies, from the ratios of the currents and the voltages at each of the respectively different frequencies. This processing is an example of processing by the computing section.

Moreover, in step 82, in the same way as in previously-described step 54, the monitoring ECU 30 extracts, from the resistance map, a first resistance curve that corresponds to the combination of the present temperature and SOC of the auxiliary device battery 16, and corrects the extracted first resistance curve on the basis of the resistance of the auxiliary device battery 16 at each of respectively different frequencies that were computed previously.

In step 84, in the same way as in above-described step 56, the monitoring ECU 30 respectively corrects, in the resistance map of the auxiliary device battery 16, second resistance curves that are other than the first resistance curve that was corrected in step 82, in accordance with the amount of correction for the first resistance curve. Note that step 84 is an example of the processing that corrects the first resistance curve in step 82, and processing by the correcting section.

Figure 5:
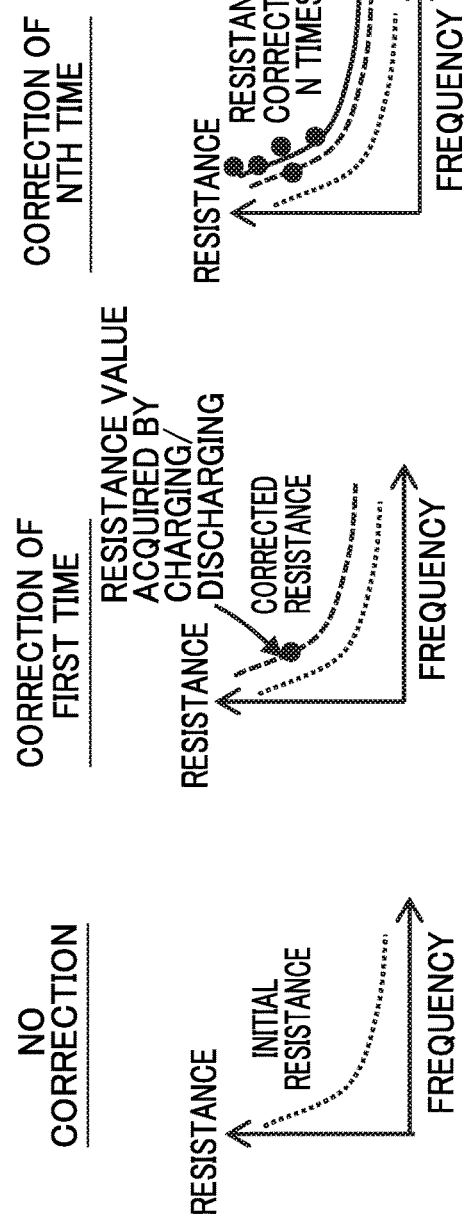
FIG. 5 is an explanatory drawing for explaining correction of the resistance map.

In step 86, the monitoring ECU 30 judges whether or not correction of the resistance map of the auxiliary device battery 16 has been carried out a predetermined number of times. If the judgment in step 86 is negative, the routine returns to step 58. The processings of step 58 and thereafter are repeated while the ignition switch of the vehicle is on, and correction of the resistance map of the auxiliary device battery 16 also is repeated (refer to FIG. 5 as well). When correction of the resistance map of the auxiliary device battery 16 has been carried out a predetermined number of times or more, the judgment in step 86 is affirmative, and the routine moves on to step 88. In step 88, the monitoring ECU 30 turns the correction completion flag on, and the routine moves on to step 58.

When the correction completion flag is turned on, the judgment in previous step 60 is affirmative, and the routine moves on to step 62. In step 62, the monitoring ECU 30 judges whether or not the assumed load voltage that was estimated in step 58 is greater than or equal to a system assurance value. If the judgment in step 62 is affirmative, the routine moves on to step 66. If the judgment in step 62 is negative, the routine moves on to step 64. In step 64, the monitoring ECU 30 warns of deterioration of the auxiliary device battery 16. Note that step 62, together with step 48, is an example of processing by the judging section.

As described above, in the present embodiment, the auxiliary device battery sensor 28 measures the current and the voltage of the auxiliary device battery 16. On the basis of the peak value of the current and the frequency measured by the auxiliary device battery sensor 28 at the time when the current and the voltage of the auxiliary device battery 16 change in accordance with the requirements of a load, the monitoring ECU 30 sets a waveform for measurement that is for measuring the resistance of the auxiliary device battery 16. Further, the monitoring ECU 30 controls the DDC 20, which is connected to the auxiliary device battery 16, such that the waveform of the current of the auxiliary device battery 16 becomes the waveform for measurement. On the basis of the current and the voltage measured by the auxiliary device battery sensor 28 at the time of controlling the DDC 20, the monitoring ECU 30 computes the resistance of the auxiliary device battery 16. Due thereto, the resistance of the auxiliary device battery 16 at the time when the current and the voltage of the auxiliary device battery 16 change in accordance with load requirements can be computed, and the accuracy of measuring the resistance of the auxiliary device battery 16 can be improved.

Further, in the present embodiment, in a case in which the peak value of the current, which is measured by the auxiliary device battery sensor 28 at the time when the current and the voltage of the auxiliary device battery 16 change in accordance with load requirements, is less than or equal to the upper limit value of control being possible at the DDC 20, the peak value of the measured current is set as the peak value of the waveform for measurement. Further, in a case in which the peak value of the current, which is measured by the auxiliary device battery sensor 28 at the time when the current and the voltage of the auxiliary device battery 16 change in accordance with load requirements, exceeds the upper limit value of control being possible at the DDC 20, the upper limit value of control being possible at the DDC 20 is set as the peak value of waveform for measurement. Due thereto, there is no need for the upper limit value of control being possible at the DDC 20 to always exceed the peak value of the current that is measured at the time when the current and the voltage of the auxiliary device battery 16 change in accordance with load requirements, and therefore, the DDC 20 can be structured inexpensively.

Further, in the present embodiment, at the time of controlling the DDC 20, the monitoring ECU 30 carries out frequency analysis on the changes in the current and the voltage measured by the auxiliary device battery sensor 28, and computes the resistance of the auxiliary device battery 16 at each of respectively different frequencies, from the ratio of the current and the voltage at each of the respectively different frequencies. Due thereto, the resistance of the auxiliary device battery 16 at each of respectively different frequencies can be computed, and the relationship between frequency of the current of the auxiliary device battery 16 and resistance of the auxiliary device battery 16 can be determined.

Further, in the present embodiment, the monitoring ECU 30 sets a waveform, which combines waveforms of the changes in the current of the auxiliary device battery 16 corresponding to respectively different loads, as the waveform for measurement. Due thereto, even in a case in which different frequency components are included in the waveforms corresponding to the respectively different loads, the resistance of the auxiliary device battery 16 at respective frequencies corresponding to the respective frequency components can be computed by the control section controlling the DDC 20 a single time.

Further, in the present embodiment, within the resistance map in which resistance curves, which express the relationship between the frequency of the current of the auxiliary device battery 16 and the resistance of the auxiliary device battery 16, are prescribed per combination of temperature and SOC of the auxiliary device battery 16, the monitoring ECU 30 corrects the first resistance curve, which corresponds to the combination of the present temperature and SOC of the auxiliary device battery 16, on the basis of the computed resistances of the auxiliary device battery 16 at respectively different frequencies. Further, the monitoring ECU 30 corrects the respective second resistance curves, which are other than the first resistance curve in the resistance map, in accordance with the amount of correction for the first resistance curve. Due thereto, a highly accurate resistance map can be obtained.

Further, in the present embodiment, the monitoring ECU 30 estimates the assumed load voltage, which is the voltage of the auxiliary device battery 16 that corresponds to the requirements of a predetermined load, from the resistance curve, which corresponds to the combination of the present temperature and SOC of the auxiliary device battery 16 in the resistance map, and the assumed load current, which is the current of the auxiliary device battery 16 that corresponds to the requirements of the predetermined load, and the frequency thereof. Further, the monitoring ECU 30 judges the deterioration of the auxiliary device battery 16 by comparing the assumed load voltage, which has been estimated, with a predetermined value. Due thereto, the assumed load voltage that corresponds to the requirements of a predetermined load can be estimated with good accuracy, and the deterioration of the auxiliary device battery 16 can be judged with good accuracy.

Note that, although the above describes a form in which the DDC 20 is controlled such that the waveform of the current of the auxiliary device battery 16 becomes the waveform for measurement, the present disclosure is not limited to this. The DDC 20 may be controlled such that the waveform of the voltage of the auxiliary device battery 16 becomes the waveform for measurement.

Further, the above describes a form in which frequency analysis is carried out by FFT on changes in the current and changes in the voltage of the auxiliary device battery 16, and the resistance of the auxiliary device battery 16 at each of respectively different frequencies is computed (steps 54, 82). However, the present disclosure is not limited to this. Groups of measured values of the current and the voltage of the auxiliary device battery 16 at the time that charging/discharging of the auxiliary device battery 16 is carried out by the DDC 20 may be plotted on a graph, and the resistance of the auxiliary device battery 16 may be computed from the slope of the change in the relationship between current and voltage.

Although the above describes a form in which only one auxiliary device battery is provided, the present disclosure is not limited to this. In a case in which an auxiliary device battery is added in application to autonomous driving or the like for example, the present disclosure may be applied to the measurement of the resistance of the added auxiliary device battery.

What is claimed is:

1. A battery resistance measuring device comprising:
   a sensor that measures a current and a voltage of a battery installed in a vehicle; and
   a processor that is configured to:
   set a waveform for measurement that is for measuring resistance of the battery, on the basis of a peak value and frequency of current or voltage that is measured by the sensor at a time when the current and the voltage of the battery change in accordance with requirements of a load that is installed in the vehicle;
   control a DCDC converter connected to the battery, such that a waveform of the current or the voltage of the battery becomes the waveform for measurement that was set by the processor; and
   compute resistance of the battery on the basis of current and voltage measured by the sensor at a time when the DCDC converter is controlled by the processor.

2. The battery resistance measuring device of claim 1, wherein, in a case in which a peak value of the current or the voltage measured by the sensor at a time when the current and the voltage of the battery change in accordance with requirements of the load, is less than or equal to an upper limit value of control being possible at the DCDC converter, the processor sets the peak value to be a peak value of the waveform for measurement, and, in a case in which the peak value of the current or the voltage measured by the sensor at the time when the current and the voltage of the battery change in accordance with requirements of the load, exceeds the upper limit value of control being possible at the DCDC converter, the processor sets the upper limit value to be the peak value of the waveform for measurement.

3. The battery resistance measuring device of claim 1, wherein, at a time when the DCDC converter is controlled by the processor, the processor carries out frequency analysis on changes in the current and the voltage measured by the sensor, and, from ratios of current and voltage at each of respectively different frequencies, computes resistances of the battery at each of respectively different frequencies.

4. The battery resistance measuring device of claim 2, wherein, at a time when the DCDC converter is controlled by the processor, the processor carries out frequency analysis on changes in the current and the voltage measured by the sensor, and, from ratios of current and voltage at each of respectively different frequencies, computes resistances of the battery at each of respectively different frequencies.

5. The battery resistance measuring device of claim 3, wherein the processor sets the waveform for measurement to be a waveform that combines waveforms of changes in the current or the voltage of the battery that correspond to each of respectively different loads.

6. The battery resistance measuring device of claim 4, wherein the processor sets the waveform for measurement to be a waveform that combines waveforms of changes in the current or the voltage of the battery that correspond to each of respectively different loads.

7. The battery resistance measuring device of claim 3, wherein, in a resistance map in which a resistance curve that expresses a relationship between frequency of the current or the voltage of the battery and resistance of the battery, is prescribed for each combination of temperature and SOC of the battery, the processor corrects a first resistance curve that corresponds to a combination of a present temperature and SOC of the battery, on the basis of resistance of the battery at each of respectively different frequencies computed by the processor, and corrects second resistance curves, which are other than the first resistance curve in the resistance map, respectively in accordance with an amount of correction for the first resistance curve.

8. The battery resistance measuring device of claim 4, wherein, in a resistance map in which a resistance curve that expresses a relationship between frequency of the current or the voltage of the battery and resistance of the battery, is prescribed for each combination of temperature and SOC of the battery, the processor corrects a first resistance curve that corresponds to a combination of a present temperature and SOC of the battery, on the basis of resistance of the battery at each of respectively different frequencies computed by the processor, and corrects second resistance curves, which are other than the first resistance curve in the resistance map, respectively in accordance with an amount of correction for the first resistance curve.

9. The battery resistance measuring device of claim 7, wherein, from a resistance curve that corresponds to the combination of the present temperature and SOC of the battery in the resistance map, and an assumed load current that is a current of the battery that corresponds to requirements of a predetermined load, and frequency thereof, the processor estimates an assumed load voltage, which is a voltage of the battery corresponding to requirements of the predetermined load, and judges deterioration of the battery by comparing the assumed load voltage that is estimated with a predetermined value.

10. The battery resistance measuring device of claim 8, wherein, from a resistance curve that corresponds to the combination of the present temperature and SOC of the battery in the resistance map, and an assumed load current that is a current of the battery that corresponds to requirements of a predetermined load, and frequency thereof, the processor estimates an assumed load voltage, which is a voltage of the battery corresponding to requirements of the predetermined load, and judges deterioration of the battery by comparing the assumed load voltage that is estimated with a predetermined value.

11. The battery resistance measuring device of claim 1, wherein the battery is a lithium ion battery.

12. The battery resistance measuring device of claim 2, wherein the battery is a lithium ion battery.

13. The battery resistance measuring device of claim 3, wherein the battery is a lithium ion battery.

14. The battery resistance measuring device of claim 1, wherein the battery is an auxiliary device battery that supplies electric power to an auxiliary device load of a vehicle.

15. The battery resistance measuring device of claim 2, wherein the battery is an auxiliary device battery that supplies electric power to an auxiliary device load of a vehicle.

16. The battery resistance measuring device of claim 3, wherein the battery is an auxiliary device battery that supplies electric power to an auxiliary device load of a vehicle.

* * * * *